(12) United States Patent
Wu et al.

(10) Patent No.: US 7,804,678 B2
(45) Date of Patent: Sep. 28, 2010

(54) CAPACITOR DEVICES

(75) Inventors: Shih-Hsien Wu, Yangmei Town (TW); Shinn-Juh Lai, Zhudong Town (TW); Min-Lin Lee, Hsinchu (TW); Shur-Fen Liu, Baoshan Village (TW)

(73) Assignee: Industrial Technology Research Institute, Hsinchu (TW)

( * ) Notice: Subject to any disclaimer, the term of this patent is extended or adjusted under 35 U.S.C. 154(b) by 334 days.

(21) Appl. No.: 11/844,280

(22) Filed: Aug. 23, 2007

(65) Prior Publication Data

US 2008/0266750 A1 Oct. 30, 2008

Related U.S. Application Data

(60) Provisional application No. 60/914,028, filed on Apr. 25, 2007.

(51) Int. Cl.
*H01G 4/06* (2006.01)
(52) U.S. Cl. ............... 361/311; 361/312; 361/313; 361/303; 361/321.1; 361/321.2
(58) Field of Classification Search ............ 361/311, 361/312, 313, 321.1, 321.2, 306.1, 306.3, 361/303–305, 301.4
See application file for complete search history.

(56) References Cited

U.S. PATENT DOCUMENTS

| | | | |
|---|---|---|---|
| 5,973,929 A * | 10/1999 | Arakawa et al. ............ 361/762 |
| 6,498,714 B1 * | 12/2002 | Fujisawa et al. ......... 361/306.3 |
| 6,524,926 B1 * | 2/2003 | Allman et al. ............. 438/387 |
| 6,593,185 B1 * | 7/2003 | Tsai et al. .................. 438/253 |
| 6,657,849 B1 | 12/2003 | Andresakis et al. |
| 6,678,144 B2 * | 1/2004 | Higashi et al. ........... 361/306.3 |
| 6,706,588 B1 * | 3/2004 | Ning .......................... 438/250 |
| 6,747,334 B2 * | 6/2004 | Kitagawa et al. ............ 257/532 |
| 7,531,011 B2 * | 5/2009 | Yamasaki ................ 29/25.03 |
| 2002/0001164 A1 | 1/2002 | Ahn et al. |

FOREIGN PATENT DOCUMENTS

| | | |
|---|---|---|
| CN | 1458692 | 11/2003 |
| JP | 2002-289462 | 10/2002 |
| JP | 2004-214433 | 7/2004 |
| JP | 2006-287201 | 10/2006 |

OTHER PUBLICATIONS

Chinese office action issued in counterpart Application No. 200810003421.4 (18 pages).

* cited by examiner

*Primary Examiner*—Nguyen T Ha
(74) *Attorney, Agent, or Firm*—Finnegan, Henderson, Farabow, Garrett & Dunner, LLP (57) ABSTRACT

A capacitor device with a capacitance is introduced. The capacitor device includes at least one capacitive element. The at least capacitive element comprises a pair of first conductive layers being opposed to each other, at least one first dielectric layer formed on a surface of at least one of the first conductive layers, and a second dielectric layer being sandwiched between the first conductive layers. The first dielectric layer has a first dielectric constant and the second dielectric layer has a second dielectric constant. The capacitance of the capacitor device depends on dielectric parameters of the first dielectric layer and the second dielectric layer. The dielectric parameters comprise the first dielectric constant and thickness of the at least one first dielectric layer and the second dielectric constant and thickness of the second dielectric layer.

14 Claims, 12 Drawing Sheets

CAPACITOR DEVICES

BACKGROUND OF THE INVENTION

1. Field of the Invention

This invention generally relates to capacitors, and more particularly, to capacitors that may be embedded within printed circuit boards or other microelectronic devices.

2. Background of the Invention

Capacitors are devices used for introducing capacitance into a circuit. Capacitors function primarily to store electrical energy, block the flow of direct current, or permit the flow of alternating current. They comprise a layer of dielectric material sandwiched between a pair of spaced conductive metal layers, such as copper foils.

Capacitors are common elements on printed circuit boards (PCBs) and other microelectronic devices. In recent years, substantial efforts have been expended in the design of such PCBs and devices arranged thereupon to compensate for voltage fluctuations arising between the power and ground planes in the PCBs. One common type of voltage fluctuations include "switching noises," which may be caused by switching operation of transistors in the integrated circuits. A common solution to this problem is to place one or more capacitors serving as a decoupling capacitors or bypass capacitors, which may be coupled between the power and ground terminals in proximity to the integrated circuits.

Capacitors may be electrically connected either as discrete elements on a circuit board, or may be embedded within the circuit boards. Of these options, forming embedded capacitors within the circuit boards allows increased surface area of the board for other purposes.

Two main factors for selection of a capacitor include the capacitance and the frequency bandwidth of a capacitor. The frequency bandwidth of a capacitor depends on its self-resonance frequency because a capacitor behaves properly when it operates in a frequency below the self-resonance frequency. Equation (1) below shows the relationship between capacitance and self-resonance frequency of a capacitor:

$$fr = \frac{1}{2\pi\sqrt{LC}} \qquad (1)$$

where $f_r$ represents the self-resonance frequency, L represents the parasitic inductance (i.e., equivalent series inductance "ESL"), and C represents the parasitic capacitance (i.e., equivalent series capacitance "ESC"). According to Eq. (1), a capacitor with smaller capacitance may have higher self-resonance frequency, thereby having a broad frequency bandwidth. On the other hand, a capacitor with larger capacitance may have lower self-resonance frequency, thereby having a narrow frequency bandwidth. However, for decoupling capacitors, it is highly desirable to have a high self-resonance frequency and high capacitance.

Capacitance, in general, can be determined by the equation below:

$$C = \varepsilon \frac{A}{d} \qquad (2)$$

where C represents the capacitance of the capacitor in Farads, $\in$ represents the dielectric constant of the dielectric material, and A represents the surface area of the dielectric material held between two conducting plates and d represents the distance between the plates. According to Eq. (2) above, capacitance is proportional to the surface area of the conducting plates and the dielectric constant of the dielectric material, and inversely proportional to the distance between the plates. Thus, in order to increase the capacitance of a capacitor, one may increase the area of the conducting plates or select an extremely thin layer of a dielectric material with a high dielectric constant. However, each of these approaches presents difficulties. First, increasing the area of the conducting plates departs from the object of compact designs. In addition, the selection of the dielectric material is often limited by many production and configuration limitations. Additional difficulties arise when the thickness of a dielectric layer is reduced. In particular, the thickness of a dielectric layer on a circuit board can be difficult to control because dielectric thickness may be dramatically changed due to the shapes and dimensions of the patterned features (e.g., capacitor electrodes) over which dielectric is deposited. A thin-dielectric layer design usually comes with the danger of having metal-to-metal shorting through the thin dielectric layer and of having microscopic voids or other structural defects in the layer that may impact capacitive effects and characteristics.

BRIEF SUMMARY OF THE INVENTION

Examples consistent with the present invention may provide a capacitor device with a capacitance and a method of fabricating a capacitor.

One example of the present invention provides a capacitor device with a capacitance comprising at least one capacitive element. The at least one capacitive element comprises a pair of first conductive layers being opposed to each other, at least one first dielectric layer formed on a surface of at least one of the first conductive layers, and a second dielectric layer being sandwiched between the first conductive layers. The first dielectric layer has a first dielectric constant and the second dielectric layer has a second dielectric constant. The capacitance of the capacitor device depends on dielectric parameters of the first dielectric layer and the second dielectric layer. The dielectric parameters comprise the first dielectric constant and thickness of the at least one first dielectric layer and the second dielectric constant and thickness of the second dielectric layer.

Another example of the present invention provides a method of fabricating a capacitor comprising providing a pair of first conductive layers, forming at least one first dielectric layer on one of the first conductive layers, and laminating the first conductive layers and the at least one first dielectric layer with a second dielectric layer.

One example consistent with the present invention provides a capacitor device comprising a number of capacitive elements. At least one of the capacitive elements comprises a first conductive layer and a second conductive layer being opposed to the first conductive layer, at least one first dielectric layer formed on a surface of at least one of the first and the second conductive layers, and a second dielectric layer being sandwiched between the first and the second conductive layers via the at least one first dielectric layer. The first dielectric layer has a first dielectric constant and the second dielectric layer has a second dielectric constant. At least one of the first and the second conductive layers of the capacitive element is coupled to a conductive layer of another capacitive element.

Another example consistent with the present invention provides a capacitor device having a number of capacitive elements. The capacitor device comprises a first capacitive element comprising a pair of first conductive layers being opposed to each other, at least one first dielectric layer formed on a surface of at least one of the first conductive layers, and a second dielectric layer being sandwiched between the first conductive layers via the at least one first dielectric layer. The capacitor device further comprises a second capacitive element comprising a pair of second conductive layers being opposed to each other, at least one third dielectric layer formed on a surface of at least one of the second conductive layers, and a fourth dielectric layer being sandwiched between the second conductive layers via the at least one third dielectric layer. The at least one first dielectric layer has a first dielectric constant and the at least one third dielectric layer has a third dielectric constant. The third dielectric constant being different from the first dielectric constant.

One example consistent with the present invention provides a capacitor device with a capacitance. The capacitor device comprises a pair of first conductive layers being opposed to each other, and a dielectric layer being sandwiched between the first conductive layers. The dielectric layer comprises at least a first dielectric material with a first dielectric constant and a second dielectric material with a second dielectric constant different from the first dielectric constant to form at least two capacitive elements in parallel sharing the first conductive layers.

BRIEF DESCRIPTION OF THE SEVERAL VIEWS OF THE DRAWINGS

The foregoing summary, as well as the following detailed description of the invention, will be better understood when read in conjunction with the appended, exemplary drawings. It should be understood, however, that the invention is not limited to the precise arrangements and instrumentalities shown.

In the drawings.

DETAILED DESCRIPTION OF THE INVENTION

Figure 1A:
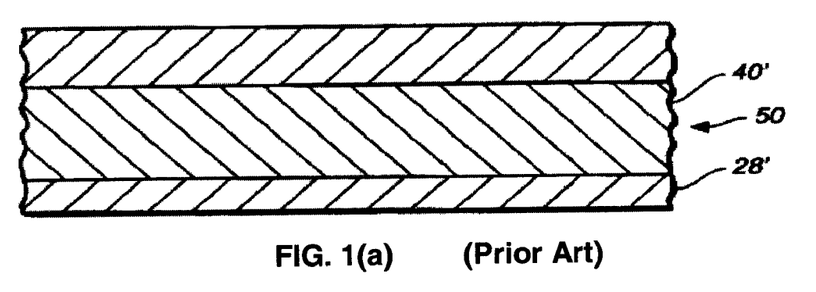
FIGS. 1(a)-(d) are cross-sectional views of a metal-insulator-metal capacitor in the prior art.
Figure 1B:
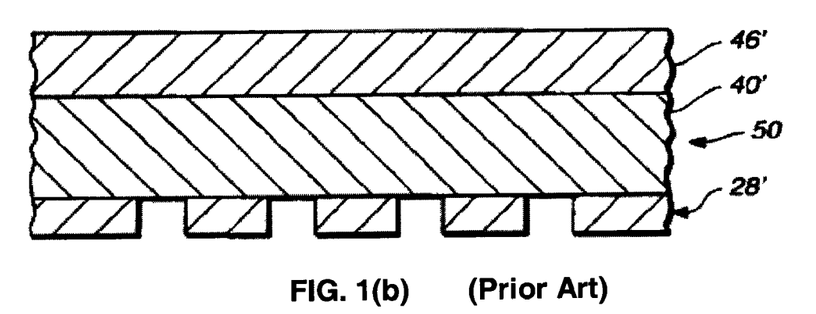
Figure 1C:
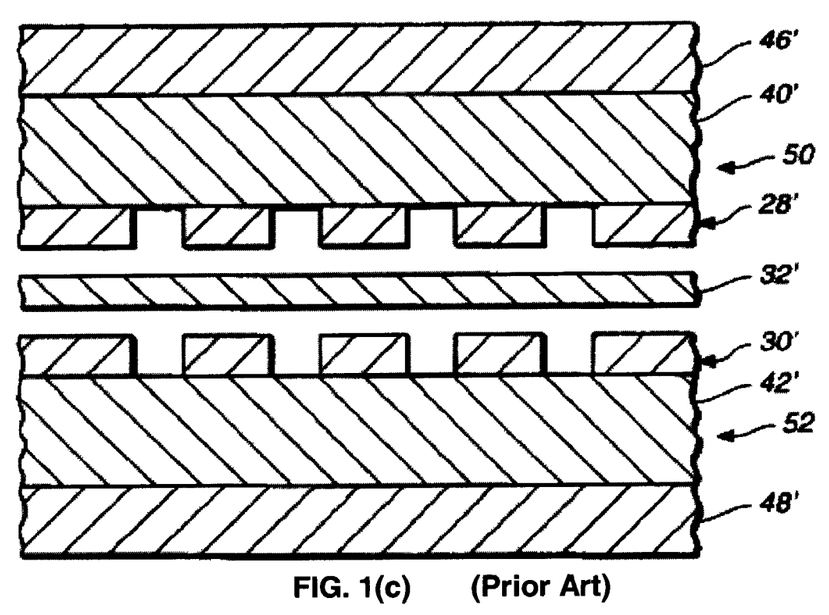
Figure 1D:
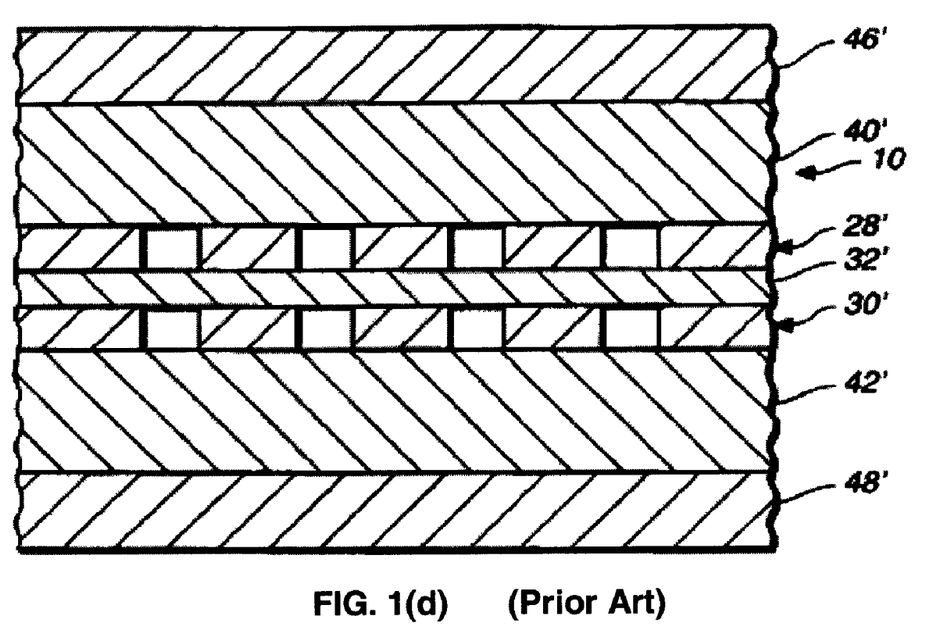

U.S. Pat. No. 5,800,575 describes one method of fabricating a metal-insulator-metal (MIM) capacitor. Referring to FIG. 1(a), the fabrication process may start from forming an initial lamination product 50 which includes the fully cured dielectric sheet 40' with conductive foils 28' and 46' laminated or bonded on opposite sides of the dielectric sheet 40'. Thereafter, the conductive foil 28' is etched as indicated in FIG. 1(b). Referring to FIG. 1(c), another lamination product 52 is formed in a similar manner as the lamination product 50. The lamination product 52 includes the other dielectric layer 42' and the conductive foils 30' and 48'. An uncured dielectric sheet 32' is then arranged between the lamination products 50 and 52 so that it is adjacent to both the conductive foils 28' and 30'. After a conventional lamination to convert the uncured dielectric sheet 32' to a fully cured condition, the finished capacitive PCB 10' is formed as shown in FIG. 1(d). The thickness of the dielectric sheet 32' is usually reduced in order to obtain large capacitance. However, a thin-dielectric sheet design may cause undesirable metal-to-metal shorting through the thin dielectric sheet.

Figure 2A:
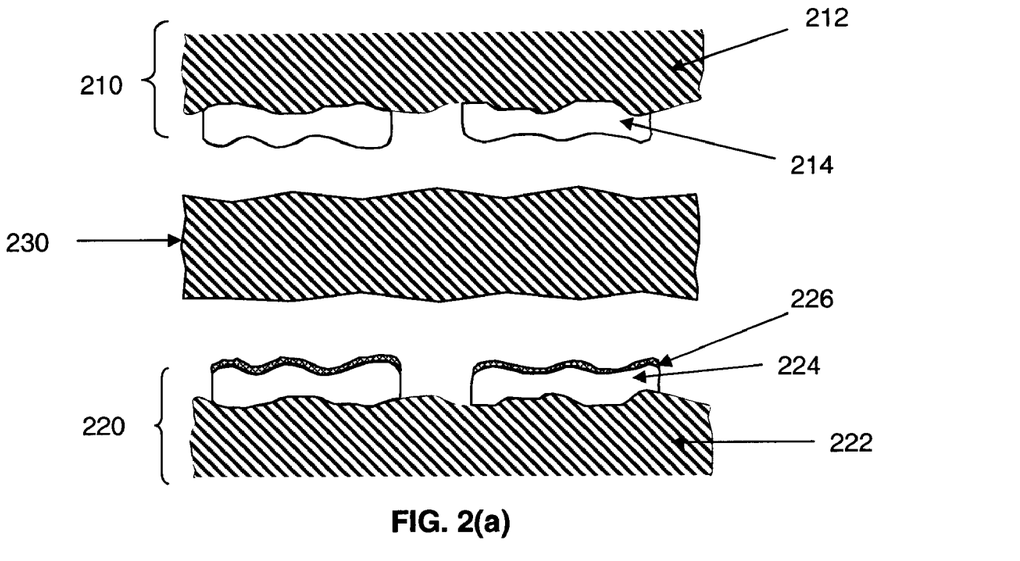
FIGS. 2(a)-(f) are cross-sectional views of a metal-insulator-metal capacitor in examples consistent with the present invention.

One example of the present invention provides a capacitor which comprises at least one dielectric layer coated on at least one of the conductive layers serving as electrodes of a capacitor, prior to lamination with an intermediate dielectric layer. In this manner, the conductive layers are protected by the at least one dielectric layer from contacting each other. FIGS. 2(a)-(f) show methods of fabricating a metal-insulator-metal capacitor in examples consistent with the present invention. The fabrication process may include forming an initial structure 210 which includes a carrier 212 and a conductive layer 214. In some examples, the carrier 212 may include prepreg, which may be a reinforced material impregnated with epoxy resin or fiber-reinforced material coated with epoxy. In one example, the carrier 212 may have a thickness between about 9 μm to 36 μm and is made of one or more conductive materials, such as copper. The conductive layer 214 may be etched as shown in FIG. 2(a). The conductive layer appropriate for the purpose of the present invention may vary depending on the desired applications. In some examples, the conductive layer 214 may include a material selected from the group consisting of copper, zinc, brass, chrome, chromates, titanium nitride, nickel, silanes, aluminum, stainless steel, iron, gold, silver, titanium, and combinations thereof. In one example, the conductive layer 214 may include or be made of copper, and its thickness may be in the range from 5 μm to 75 μm.

As shown in FIG. 2(a), similar to structure 210, another initial structure 220 is formed to include a carrier 222 and a conductive layer 224. Prior to lamination of the structures 210 and 220 with an intermediate dielectric layer 230, another dielectric layer is formed on at least one of the conductive layers 214 and 224. For example, a dielectric layer 226 is formed on the conductive layers 224 as shown in FIG. 2(a) and dielectric layers 216 and 226 are formed on one of the conductive layers 214 and one of the conductive layers 224 as shown in FIG. 2(c). In another example, two dielectric layers 216 and 226 are formed on the both conductive layers 214 and 224 as shown in FIG. 2(e). The dielectric layer may be formed by screen printing, inkjet printing, or any other technique that may provide a thin dielectric layer. The dielectric layer may include a dielectric material having a dielectric constant as high as several hundred and may have a thickness of about 5 μm, but the thickness may be varied depending on the various applications. Examples of high dielectric constant or high K materials may include epoxies, polyesters, polyester containing copolymers, aromatic theromosetting copolyesters, polyarylene ethers and fluorinated polyarylene ethers, polyimides, benzocyclobutenes, liquid crystal polymers, allylated polyphenylene ethers, amines, inorganic materials such as barium titanate ($BaTiO_3$), boron nitride (BN), aluminum oxide ($Al_2O_3$), silica, strontium titanate, barium strontium titanate, quartz and other ceramic and non-ceramic inorganic materials and combinations thereof.

Figure 2B:
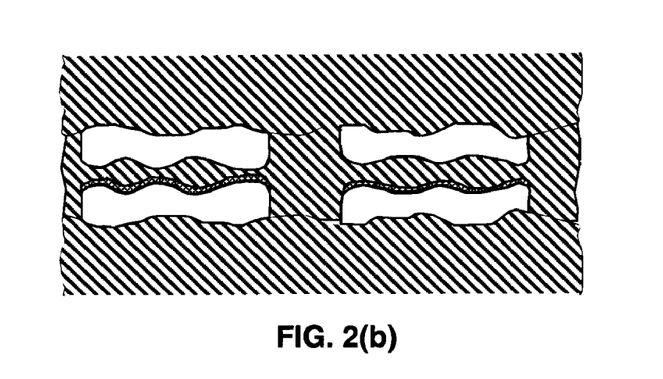
Figure 2C:
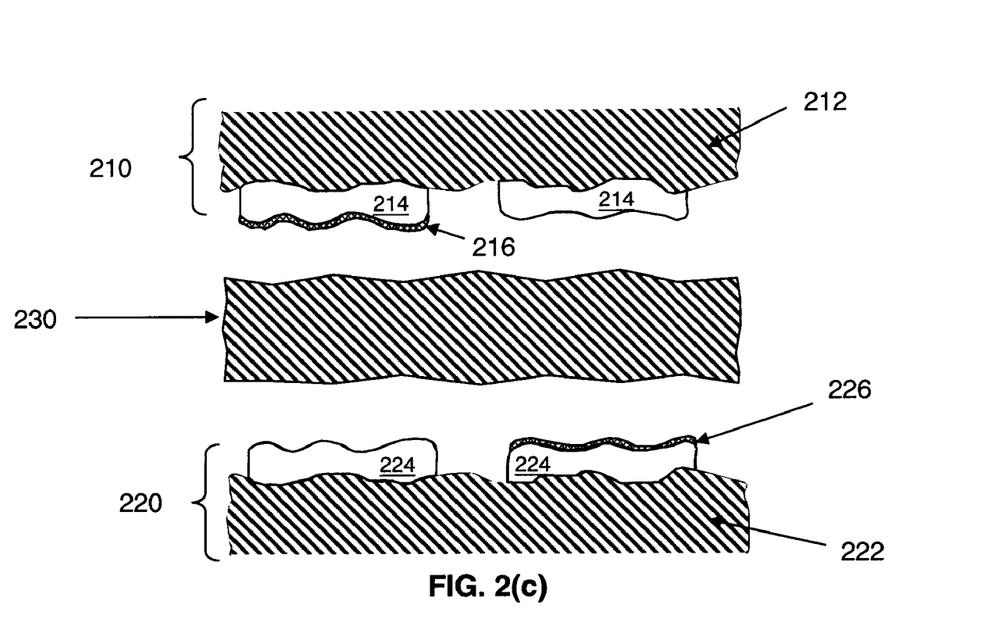
Figure 2D:
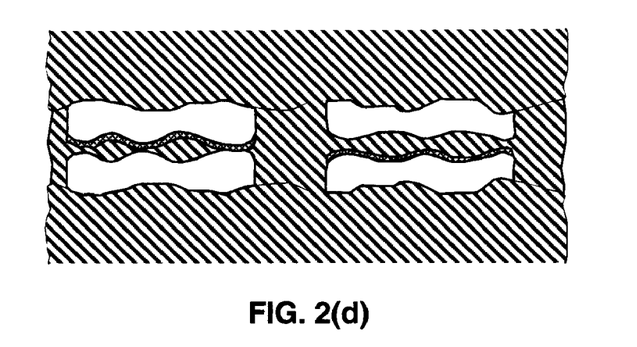
Figure 2E:
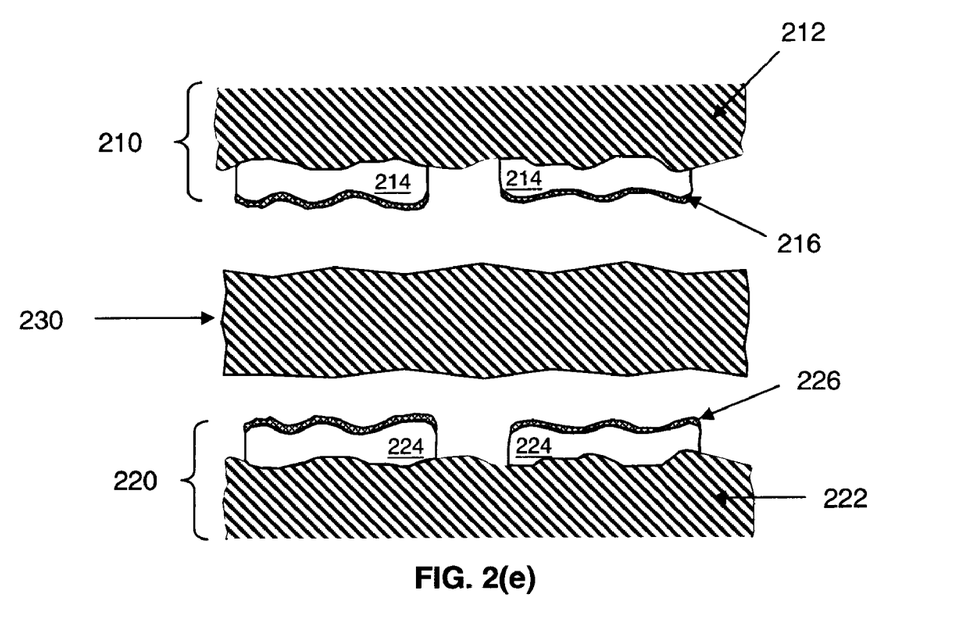
Figure 2F:
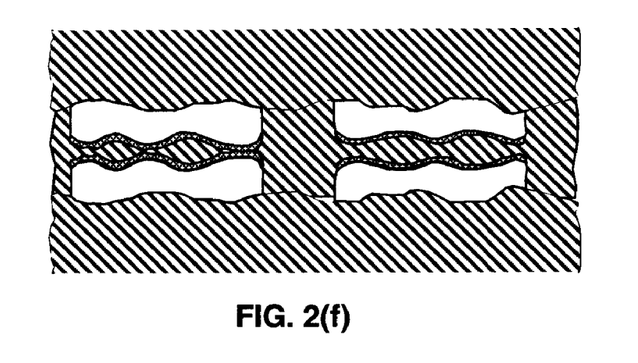

After the at least one dielectric layer is applied to one of the conductive layers 214 and 224, the two structures 210 and 220 may be pressed against the intermediate dielectric layer 230 to form a structure as illustrated in FIGS. 2(b), 2(d) or 2(f), where portions of the intermediate dielectric layer 230 are sandwiched between the conductive layers 214 and 224 via at least one dielectric layer 216 and/or 226. The dielectric layer 230 may be a dielectric material with a high dielectric constant as described above. In one example, the dielectric constant of the dielectric layer 230 may be lower than the dielectric constant of the dielectric layer 216 and/or 226. The thickness of the dielectric layer 230 may be about 20 μm.

With the capacitor design illustrated above, the conductive layers 214 and 224 are protected by the dielectric layer 216 and/or 226 from making contacts or shorting with each other. In addition, by having a dielectric structure comprising the dielectric layer 230 and the dielectric layer 216 or 226, the dielectric constant of the dielectric structure may be controlled by the intermediate dielectric layer 230, and the dielectric layers 216 and 226. In addition, the capacitance depends on the thickness of the dielectric layers 216 and/or 226 and the intermediate dielectric layer 230.

Figure 3A:
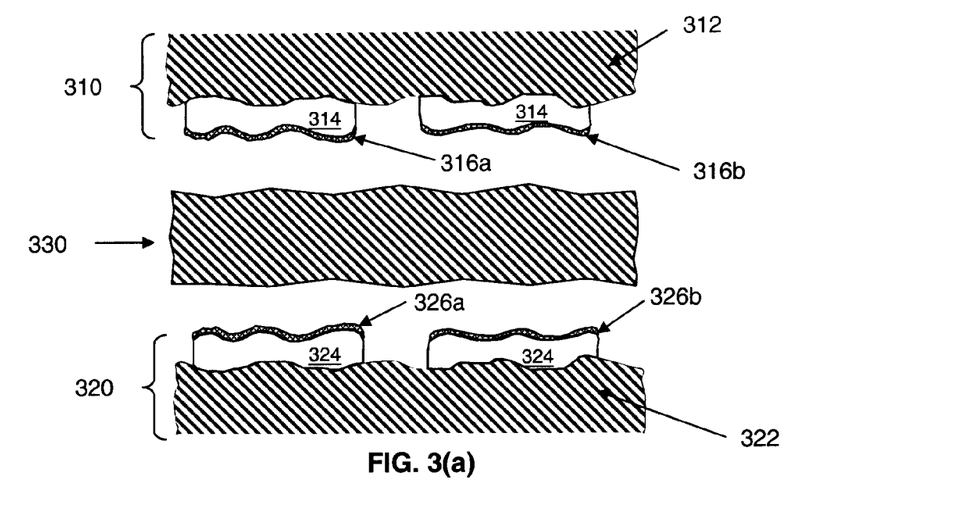
FIGS. 3(a)-(b) are cross sectional views of a metal-insulator-metal capacitor in examples consistent with the present invention.
Figure 3B:
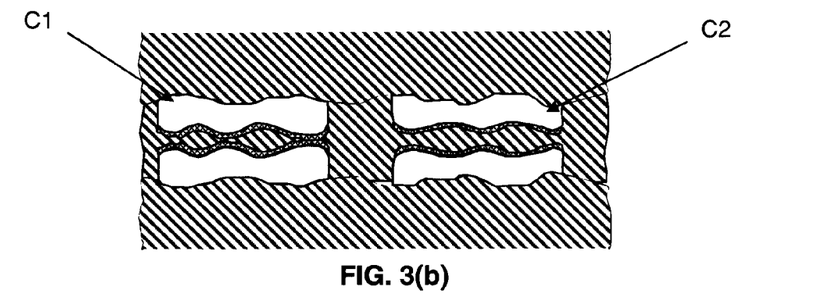
Figure 3C:
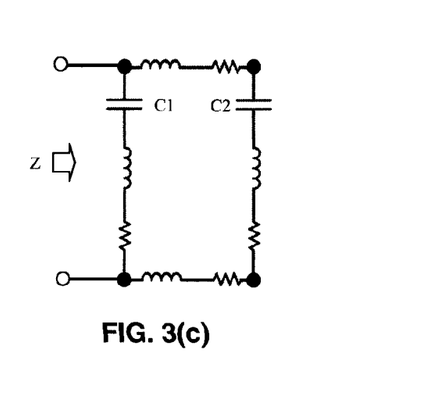
FIG. 3(c) is an equivalent electrical circuit of structure of FIG. 3(b)
Figure 3D:
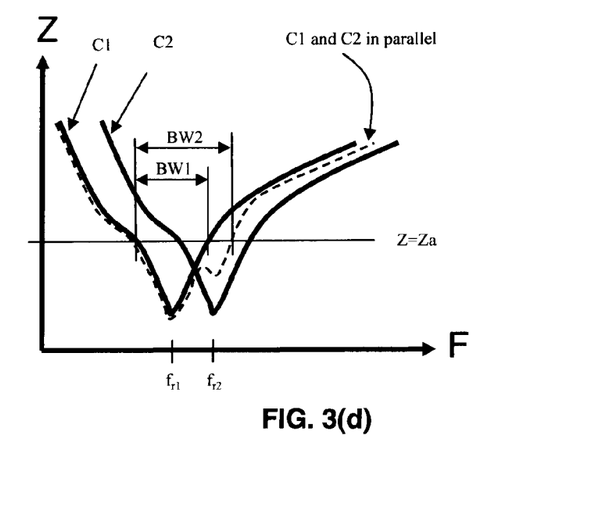
FIG. 3(d) is an impedance curve of a capacitor of FIG. 3(b)

FIGS. 3(a) and 3(b) show fabrication of an MIM capacitor in examples consistent with the present invention. Referring to FIG. 3(a), each of the structures 310 and 320 includes a carrier (312 or 322) and a conductive layer (314 or 324). On the patterned conductive layers 314 and 324, dielectric layers are formed. The dielectric layers formed on the patterned conductive layers 314 and 324 may have different dielectric constants by having different dielectric materials or different combination of dielectric materials. In one example, the dielectric layer 316a has the same dielectric constant as the dielectric layer 326a while the dielectric layer 316b has the same dielectric constant as the dielectric layer 326b. After lamination of the structures 310 and 320 with the intermediate dielectric layer 330, capacitors C1 and C2 are formed as shown in FIG. 3(b). Since the dielectric constant for the capacitor C1 is different from the dielectric constant for the capacitor C2, the capacitors C1 and C2 have different capacitance. An equivalent electrical circuit of FIG. 3(b) is shown in FIG. 3(c) where the capacitors C1 and C2 are connected in parallel. FIG. 3(d) is the impedance curve of capacitors of FIG. 3(b), which shows that, with capacitors in parallel, the bandwidth, such as the bandwidth for reducing or eliminating noises of different frequencies, for the capacitors may become broader.

Figure 4A:
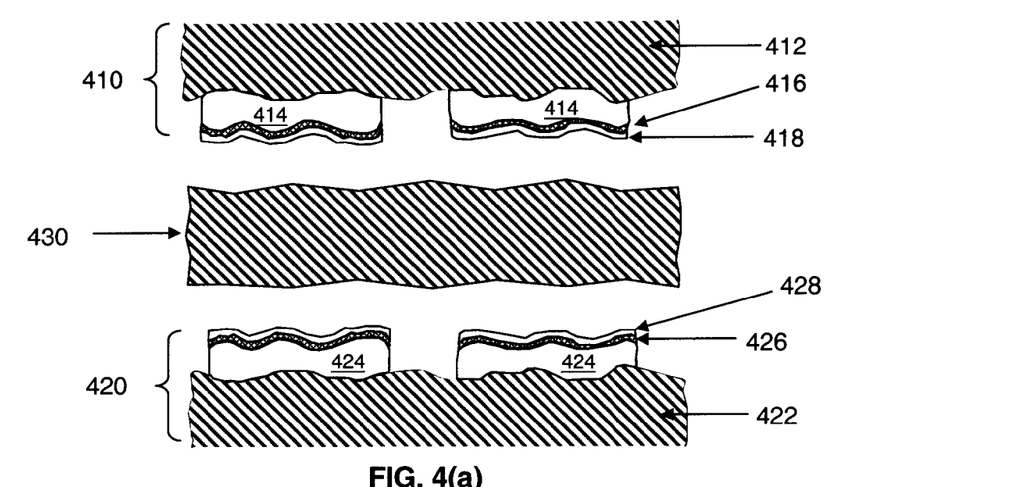
FIGS. 4(a)-(b) are cross sectional views of a metal-insulator-metal capacitor in examples consistent with the present invention.
Figure 4B:
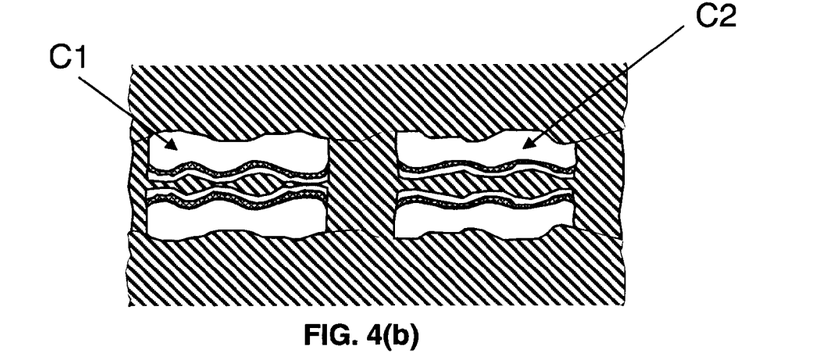
Figure 4C:
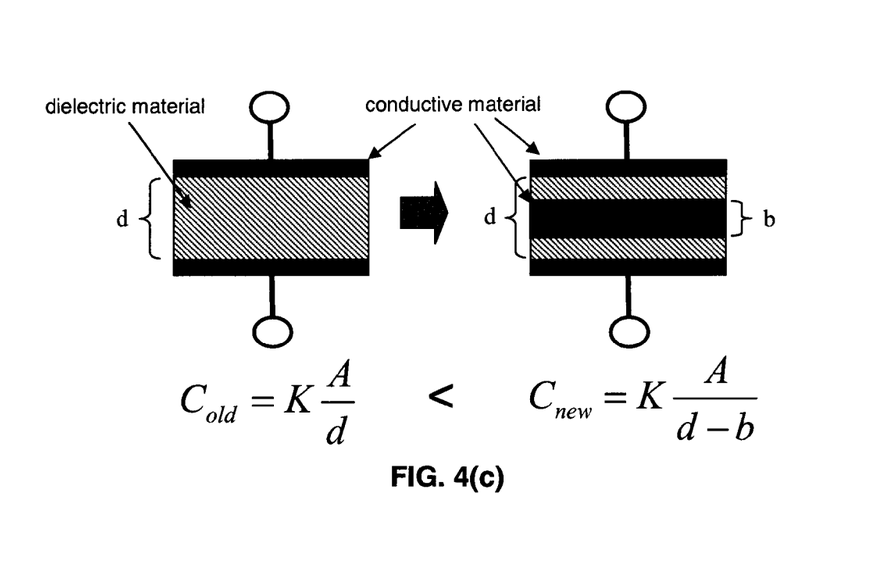
FIG. 4(c) shows equivalent structure of FIG. 4(b)

FIGS. 4(a)-(b) show an MIM capacitor consistent with examples of the present invention. Similar to FIG. 3(a), each structure (410 or 420) includes a carrier (412 or 422), a patterned conductive layer (414 or 424), and a dielectric layer (416 or 426) on the patterned conductive layer. In addition, there are thin conductive layers 418 and 428 formed on each dielectric layer as shown in FIG. 4(a). After lamination of the two structures 410 and 420 with the dielectric layer 430, a capacitor with higher capacitance as shown in FIG. 4(b) may be formed. As illustrated in FIG. 4(c), the distance between the conductive layers 414 and 424 may be reduced by the thin conductive layers 418 and 428. Accordingly, the capacitance may increase. In one example, a number of thin conductive layers may be included between the conductive layers 414 and 424 to reduce the distance between the conductive layers, thereby increasing the capacitance. The conductive layers and the thin conductive layers may include or be made of one or more of the conductive materials noted above. The thin conductive layers 418 and 428 may be formed on an underlying dielectric layer using a printing and/or coating technique. Each dielectric layer may include or be made of one or more high dielectric constant materials noted above and may be printed and/or coated on its underlying layer.

Figure 5A:
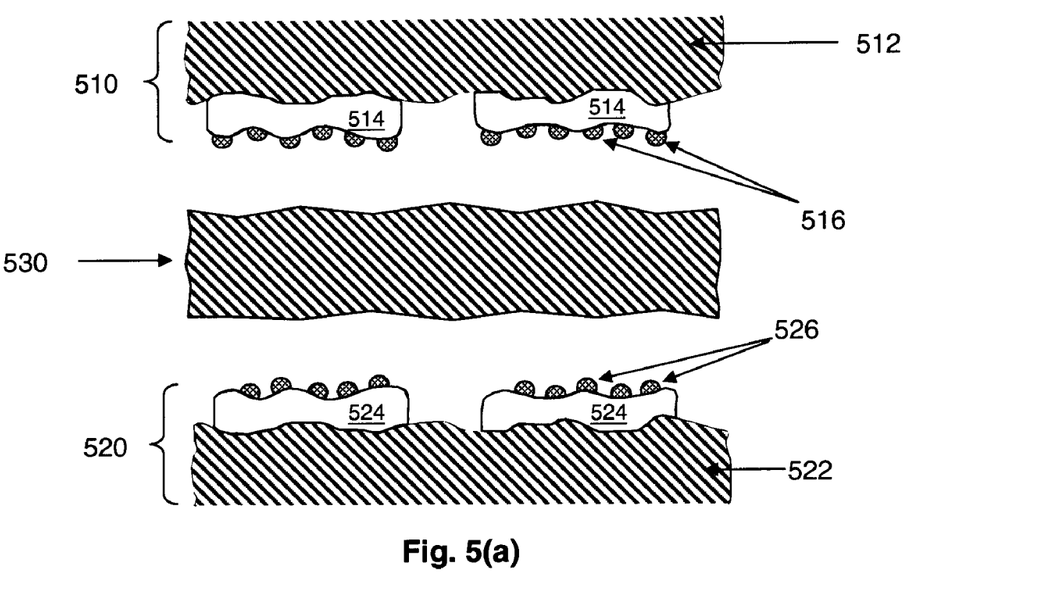
FIGS. 5(a)-(e) are cross sectional views of a metal-insulator-metal capacitor in examples consistent with the present invention.
Figure 5B:
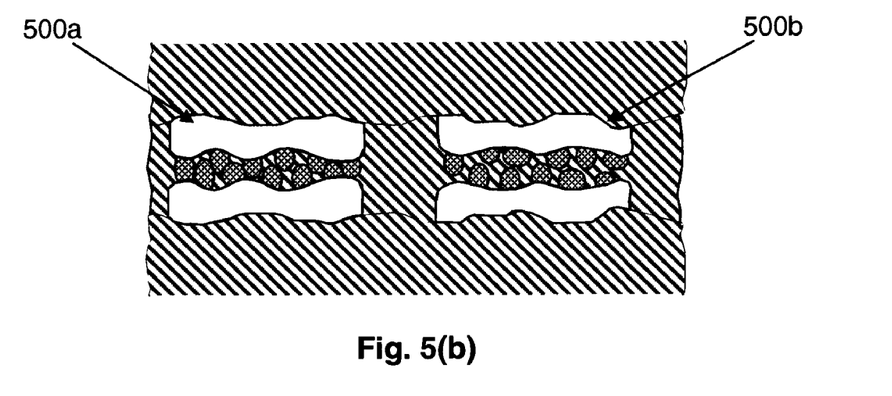

FIG. 5(a) shows an MIM capacitor in examples consistent with the present invention. In this example, the structures 510 and 520 may include a carrier (512 or 522), a conductive layer (514 or 524) and a number of spots or other patterns (516 or 526) of a high-dielectric-constant material on the surface of the conductive layers (514 or 524). The spots may be formed by inkjet printing or other techniques. The spots may form any pattern or any combination of patterns and the pattern may be formed through the control of the formation process, such as an inkjet printing process. The structures 510 and 520 with spots may be pressed against the intermediate dielectric material 530 as shown in FIG. 5(b). Where the spots 516 or 526 are formed from a dielectric material, these spots may protect the conductive layers 514 and 524 from metal-to-metal shorting. In addition, the dielectric constant for the capacitors 500a and 500b may depend on the distance between the neighboring spots.

Figure 5C:
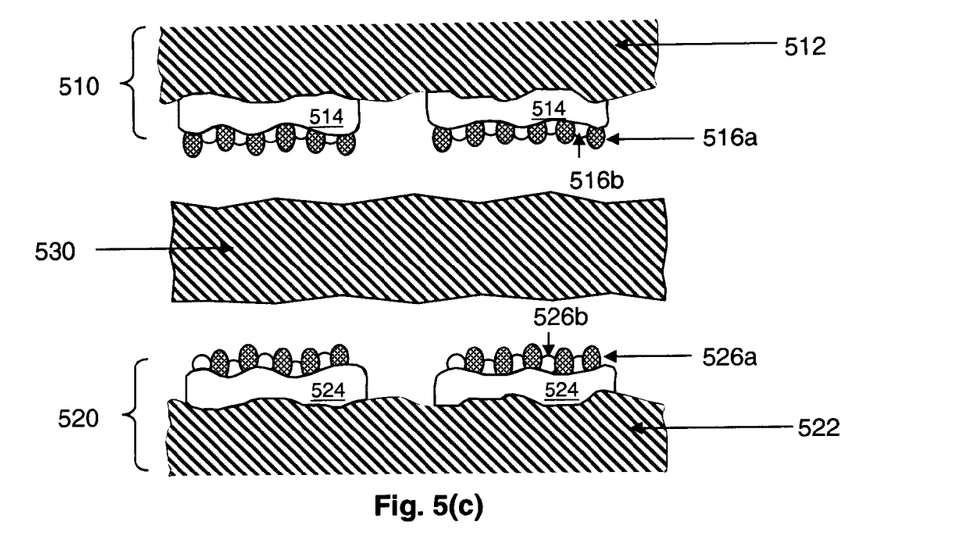
Figure 5D:
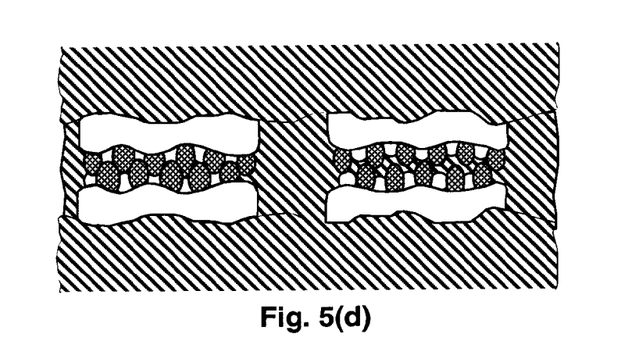
Figure 5E:
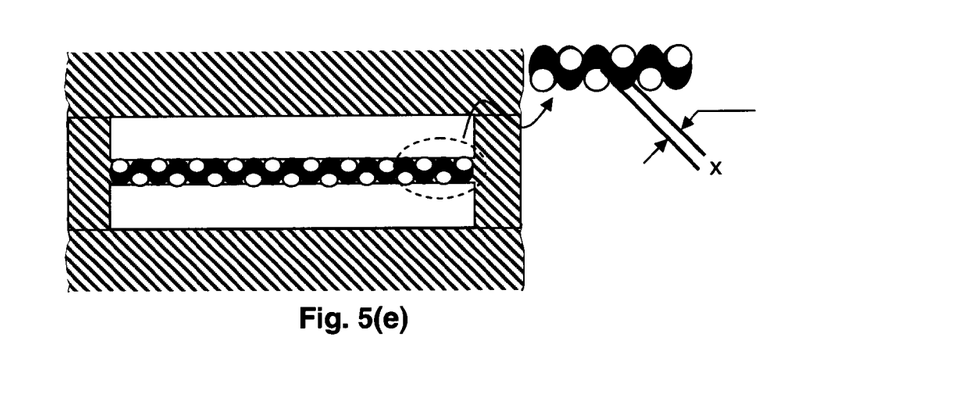

FIG. 5(c) shows another MIM capacitor in examples consistent with the present invention. Similar to FIG. 5(a), the structures 510 and 520 may include a carrier (512 or 522), a conductive layer (514 or 524) and a number of spots (516 or 526) provided on the surface of the conductive layer (514 or 524) by inkjet printing or other techniques. The spots include dielectric spots (516a or 526a) of a high dielectric constant material and conductive spots (516b or 526b) of a conductive material. The structures 510 and 520 with the spots may then be pressed against an intermediate dielectric material 530 as shown in FIG. 5(d). In one example, the dielectric spots 516a and 526a and the conductive spots 516b and 526b may form a crossed or checkered pattern. The conductive spots and dielectric spots, depending on the spot or pattern arrangements, may provide a capacitor with a wave-like dielectric layer formed by connecting the dielectric spots from the two structures, as shown in FIG. 5(e). With the illustrated example, the capacitance depends on the minimum distance x between the two conductive spots as illustrated in FIG. 5(e).

Figure 6A:
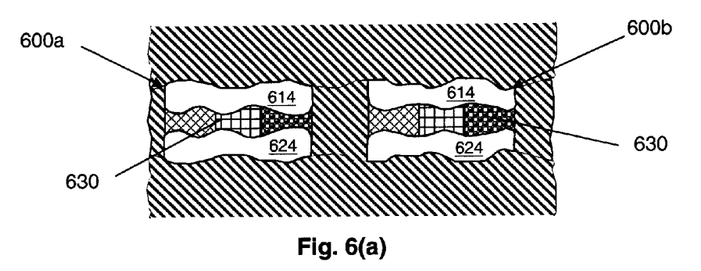
FIG. 6(a) is a cross sectional views of a metal-insulator-metal capacitor in examples consistent with the present invention.
Figure 6B:
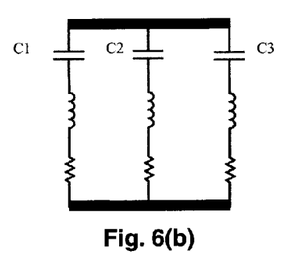
FIG. 6(b) is an equivalent electrical circuit of structure of FIG. 6(a)
Figure 6C:
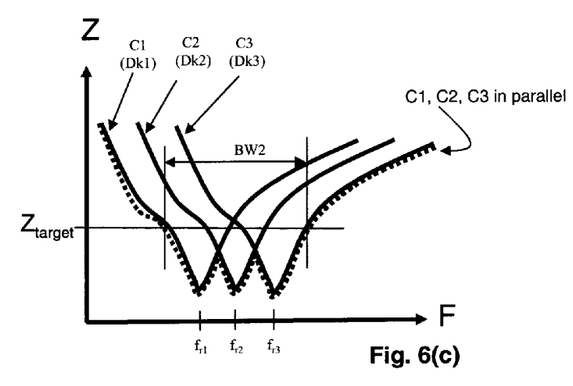
FIG. 6(c) is an impedance curve of a capacitor of FIG. 6(a)
Figure 6D:
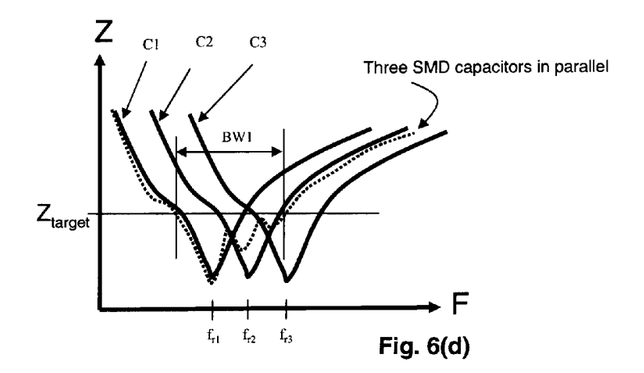
FIG. 6(d) is an impedance curve of three SMD capacitors in parallel.

In another example, the spots or the dielectric layer may be formed by dielectric materials with different dielectric constants. FIG. 6(a) shows the structure of the capacitors after lamination. Referring FIG. 6(a), capacitor 600a has a dielectric layer 630 having three different dielectric constants by having different dielectric materials or different combinations of dielectric materials. As a result, three capacitive elements in parallel are formed. Since these three capacitive elements share the conductive layers 614 and 624, no additional wiring is required for connecting these capacitive elements in parallel. FIG. 6(b) is an example of an equivalent electrical circuit of the structure of FIG. 6(a). FIG. 6(c) is the impedance curve of the capacitor of FIG. 6(a), which shows a broader effective bandwidth than that of the SMD capacitors in parallel as shown in FIG. 6(d).

Figure 7A:
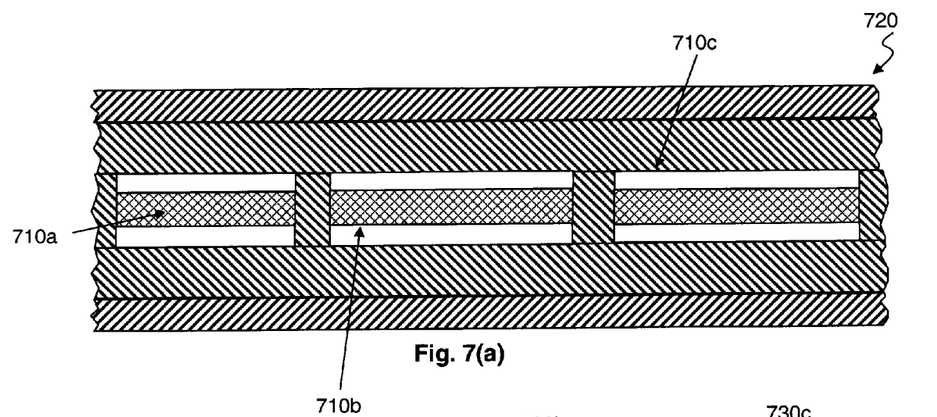
FIGS. 7(a)-7(c) show a capacitive core in examples consistent with the present invention.
Figure 7B:
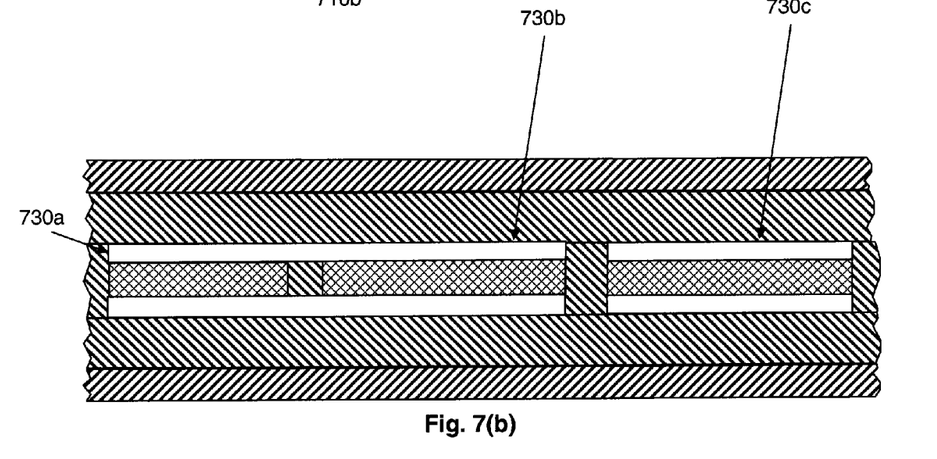
Figure 7C:
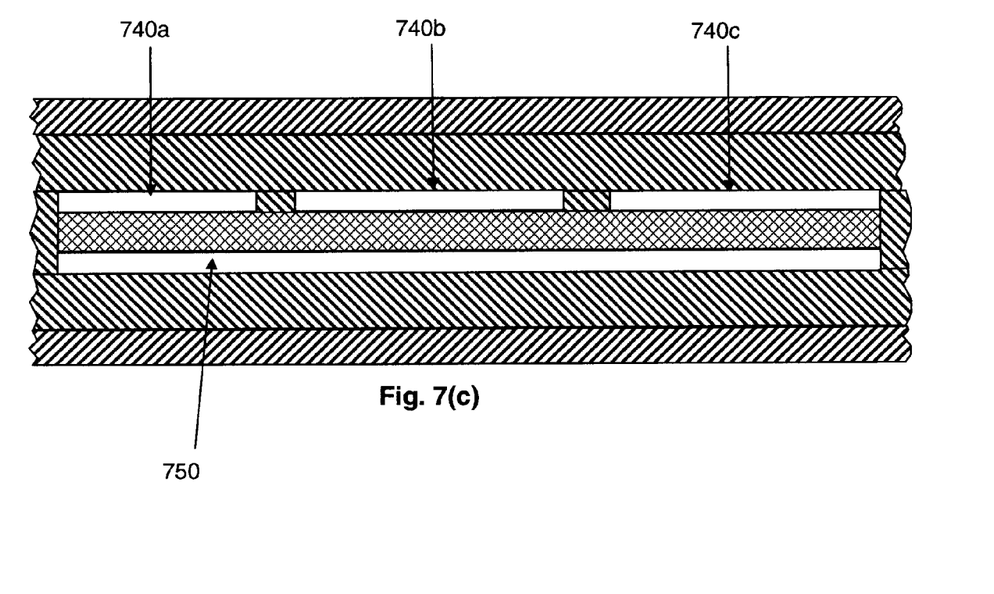

Above discussion is directed to a single MIM capacitor. In some examples, a number of capacitive elements 710a, 710b, 710c consistent with the present invention may form a set of capacitors 720 as shown in FIG. 7(a). FIG. 7(b) shows another exemplary set of MIM capacitors consistent with the present invention. FIG. 7(b) includes capacitive elements 730a and 730b in parallel and a capacitive element 730c. FIG. 7(c) shows an exemplary set of MIM capacitors consistent with the present invention. FIG. 7(c) includes capacitive elements 740a, 740b and 740c. As shown in FIG. 7(c), one of the electrodes of these three capacitors, such as the ground plane 750, may be coupled together.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A capacitor device embedded within a circuit board and having a capacitance, the capacitor device comprising:
    a pair of carriers;
    a pair of first conductive layers opposed to each other and each formed on a respective one of the carriers;
    a first dielectric layer formed on a surface of one of the first conductive layers; and
    a second dielectric layer, at least a portion of the second dielectric layer being sandwiched between one of the first conductive layers and the first dielectric layer, and the second dielectric layer surrounding sidewalls of the first conductive layers,
        wherein the capacitance of the capacitor device depends on dielectric parameters of the first dielectric layer and the second dielectric layer.

2. The capacitor device of claim 1, wherein the dielectric parameters comprise a first dielectric constant and thickness of the first dielectric layer and a second dielectric constant and thickness of the second dielectric layer.

3. The capacitor device of claim 1, further comprising at least one second conductive layer formed on the first dielectric layer.

4. The capacitor device of claim 1, wherein the conductive layer comprises a material selected from the group consisting of copper, zinc, aluminum, stainless steel, iron, gold, silver and combinations thereof.

5. The capacitor device of claim 1, wherein the at least one first dielectric layer comprises a dielectric material selected from epoxies, polyesters, inorganic materials, ceramic and non-ceramic materials and combinations thereof.

6. The capacitor device of claim 1, further comprising a third dielectric layer formed on the surface of one of the first conductive layers and adjacent to the first dielectric layer, the third dielectric layer having a third dielectric constant different from the first dielectric constant.

7. The capacitor device of claim 1, wherein the first dielectric layer comprises a first plurality of dielectric spots having a first dielectric constant.

8. The capacitor device of claim 7, wherein the capacitance of the capacitor device is determined at least in part by a space between two adjacent spots and the first dielectric constant.

9. The capacitor device of claim 7, wherein the first dielectric layer further comprises a plurality of conductive spots.

10. The capacitor device of claim 7, wherein the first dielectric layer further comprises a second plurality of dielectric spots having a second dielectric constant different from the first dielectric constant.

11. A capacitor device with a capacitance, the capacitor device comprising:
    a pair of first conductive layers being opposed to each other;
    at least one first dielectric layer formed on a surface of at least one of the first conductive layers, the at least one first dielectric layer having a first dielectric constant; and
    a second dielectric layer having a second dielectric constant, the second dielectric layer being sandwiched between the first conductive layers via the at least one first dielectric layer,
        wherein the capacitance of the capacitor device depends on dielectric parameters of the at least one first dielectric layer and the second dielectric layer; and
        wherein the at least one first dielectric layer is in a pattern formed by having a first plurality of dielectric spots in the at least one first dielectric layer.

12. The capacitor device of claim 11, wherein the capacitance of the capacitor device is determined at least in part by a space between two adjacent spots and the first dielectric constant.

13. The capacitor device of claim 11, wherein the pattern further comprises a plurality of conductive spots.

14. The capacitor device of claim 11, wherein the pattern further comprises a second plurality of dielectric spots having a second dielectric constant different from the first dielectric constant.

* * * * *